(12) United States Patent
Zhuang et al.

(10) Patent No.: US 7,474,167 B1
(45) Date of Patent: Jan. 6, 2009

(54) CAPACITANCE SWITCH CIRCUITRY FOR DIGITALLY CONTROLLED OSCILLATORS

(75) Inventors: Jingcheng Zhuang, Ottawa (CA);
Rakesh H. Patel, Cupertino, CA (US);
Tad Kwasniewski, Ottawa (CA);
Qingjin Du, Ottawa (CA)

(73) Assignee: Altera Corporation, San Jose, CA (US)

( * ) Notice: Subject to any disclaimer, the term of this patent is extended or adjusted under 35 U.S.C. 154(b) by 74 days.

(21) Appl. No.: 11/514,653

(22) Filed: Aug. 31, 2006

(51) Int. Cl.
*H03B 5/12* (2006.01)

(52) U.S. Cl. .................................. 331/177 V; 331/179

(58) Field of Classification Search ............ 331/17.7 V, 331/179, 117 R, 167, 36 C, 177 V
See application file for complete search history.

(56) References Cited

U.S. PATENT DOCUMENTS

| | | | | |
|---|---|---|---|---|
| 6,683,816 | B2 * | 1/2004 | Emmot et al. .......... | 365/230.03 |
| 6,734,741 | B2 * | 5/2004 | Staszewski et al. ....... | 331/36 C |
| 2002/0033737 | A1 * | 3/2002 | Staszewski et al. .......... | 331/17 |
| 2003/0137796 | A1 * | 7/2003 | Bulucea ..................... | 361/277 |
| 2007/0183014 | A1 * | 8/2007 | Coppola et al. ............. | 359/238 |
| 2007/0188255 | A1 * | 8/2007 | Strandberg ............... | 331/177 V |

OTHER PUBLICATIONS

Straszewski et al., "A First Multigigahertz Digitally Controlled Oscillator for Wireless Applications," IEEE Transactions on Microwave Theory and Techniques, vol. 51, No. 11, Nov. 2003, pp. 2154-2164.

* cited by examiner

*Primary Examiner*—Joseph Chang
(74) *Attorney, Agent, or Firm*—Ropes & Gray LLP

(57) ABSTRACT

Variable capacitance circuitry includes a fine tuning bank and a medium tuning bank. The fine tuning bank includes a plurality of varactors of progressively increasing size (e.g., width). Only one of these varactors is turned on at any one time. The medium tuning bank includes a plurality of similarly sized varactor circuits. These are turned on selectively in thermometer fashion (e.g., more are turned on (or off) as more (or less) overall capacitance is needed). The medium tuning bank increment is matched to the fine tuning bank range, so that when the fine tuning bank reaches an end of its range, another medium increment can be added or subtracted while the fine tuning bank is reset to the other end of its range. A uniform progression of small, incremental, capacitance changes is therefore provided over the relatively wide tuning range of the medium bank.

25 Claims, 4 Drawing Sheets

CAPACITANCE SWITCH CIRCUITRY FOR DIGITALLY CONTROLLED OSCILLATORS

BACKGROUND OF THE INVENTION

This invention relates to variable-frequency oscillator circuits, and more particularly to digitally controlled oscillator (DCO) circuits.

Voltage controlled oscillator (VCO) circuits are widely used in frequency synthesizers, clock and data recovery (CDR) circuits, and so on. The output frequency of a VCO is tuned by its analog input voltage, and the main parameters for a VCO are center frequency, frequency tuning range, VCO gain, and phase noise. Due to the nature of the frequency tuning, any noise in the control signal will modulate the VCO, resulting in more undesirable noise output. This effect can be reduced by reducing the VCO gain, but the frequency tuning range will be reduced as well because of the limited range of tuning voltage. By employing both coarse tuning and fine tuning, the gain of the fine tuning can be reduced while a large tuning range relies on the coarse tuning (which still has a very large gain).

Recently there has been increasing interest in digitally controlled oscillators (DCOs). DCOs normally have small analog gain, but the frequency resolution is typically limited. In Staszewski et al., "A First Multigigahertz Digitally Controlled Oscillator for Wireless Applications," IEEE Transactions on Microwave Theory and Techniques, Vol. 51, No. 11, November 2003, pp. 2154-64, a sigma-delta modulator is used to enhance the frequency resolution. However, this results in a complex digital circuit.

SUMMARY OF THE INVENTION

The present invention employs a capacitance tuning scheme for LC-tank-based DCOs with incremental varactors and matched varactor banks, which can achieve both high frequency resolution (i.e., small frequency steps) and large frequency tuning range with small differential nonlinearity. (LC means inductor/capacitor.)

Further features of the invention, its nature and various advantages, will be more apparent from the accompanying drawings and the following detailed description.

DETAILED DESCRIPTION

Figure 1:
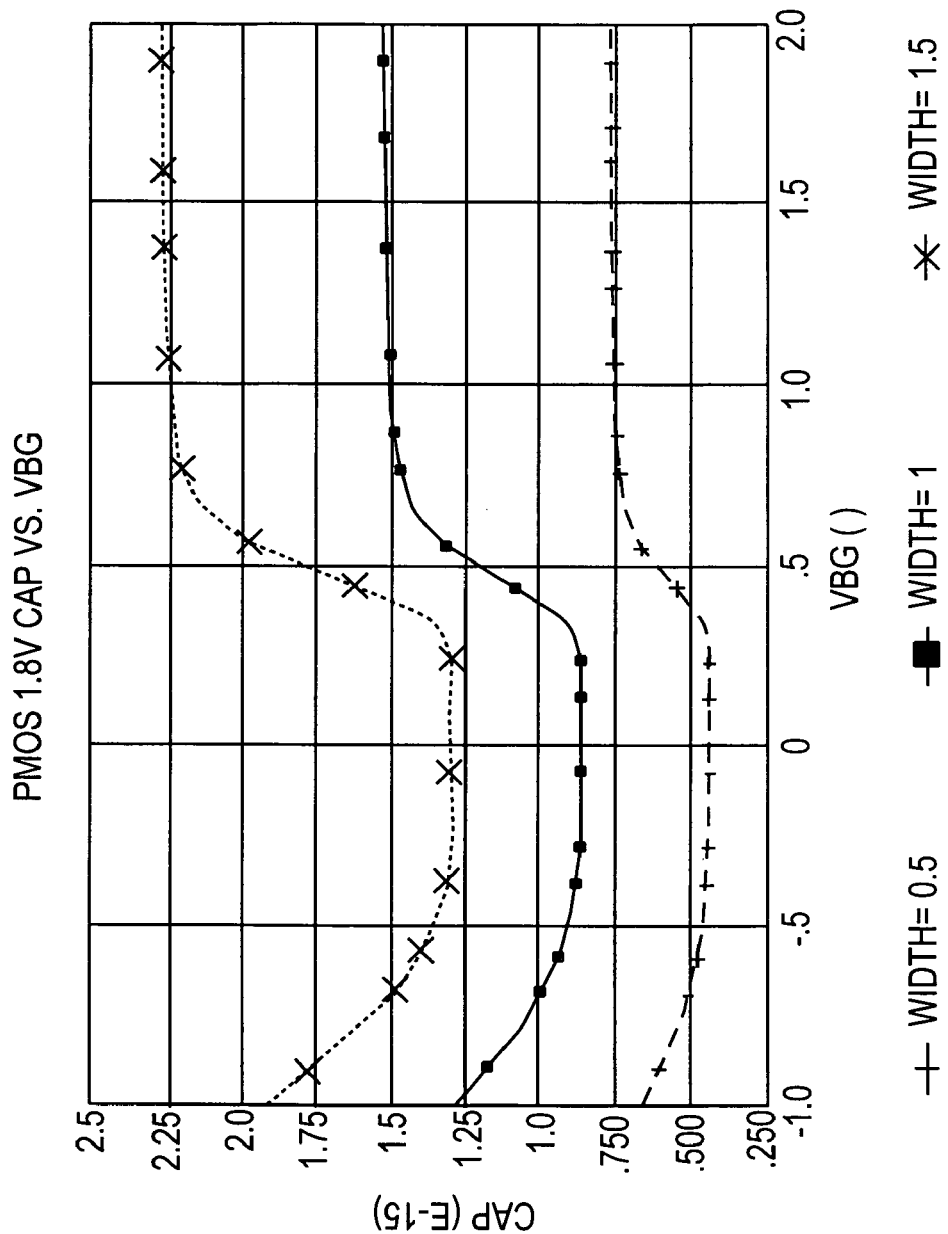
FIG. 1 is a simplified plot of typical capacitance vs. control voltage for PMOS varactors.

A MOS varactor is a well-known type of circuit element that normally has two flat regions in its V-C (voltage-capacitance) characteristic curve. These two flat regions are at approximately 0V and 1V as shown in FIG. 1. FIG. 1 shows V-C curves for varactors of three different relative widths (i.e., relative width 0.5, bottom curve; relative width 1.0, middle curve; and relative width 1.5, top curve). The two flat regions referred to above can be used as two levels of a digital switch, so that analog gain is almost zero. However, simply using a set of such varactors would mean that the minimum capacitance step would be the same as the capacitance difference between two flat regions for a MOS varactor having a minimum size. This capacitance resolution is normally not enough for a DCO. To enhance the capacitance resolution, the present invention employs MOS varactors incrementally sized for fine frequency tuning, and unit sized for medium frequency tuning. The varactor sizes are physically matched (small differential nonlinearity) and combined together directly so that both large range and small step size are achieved. The above-mentioned two types of frequency tuning are detailed below.

Figure 2:
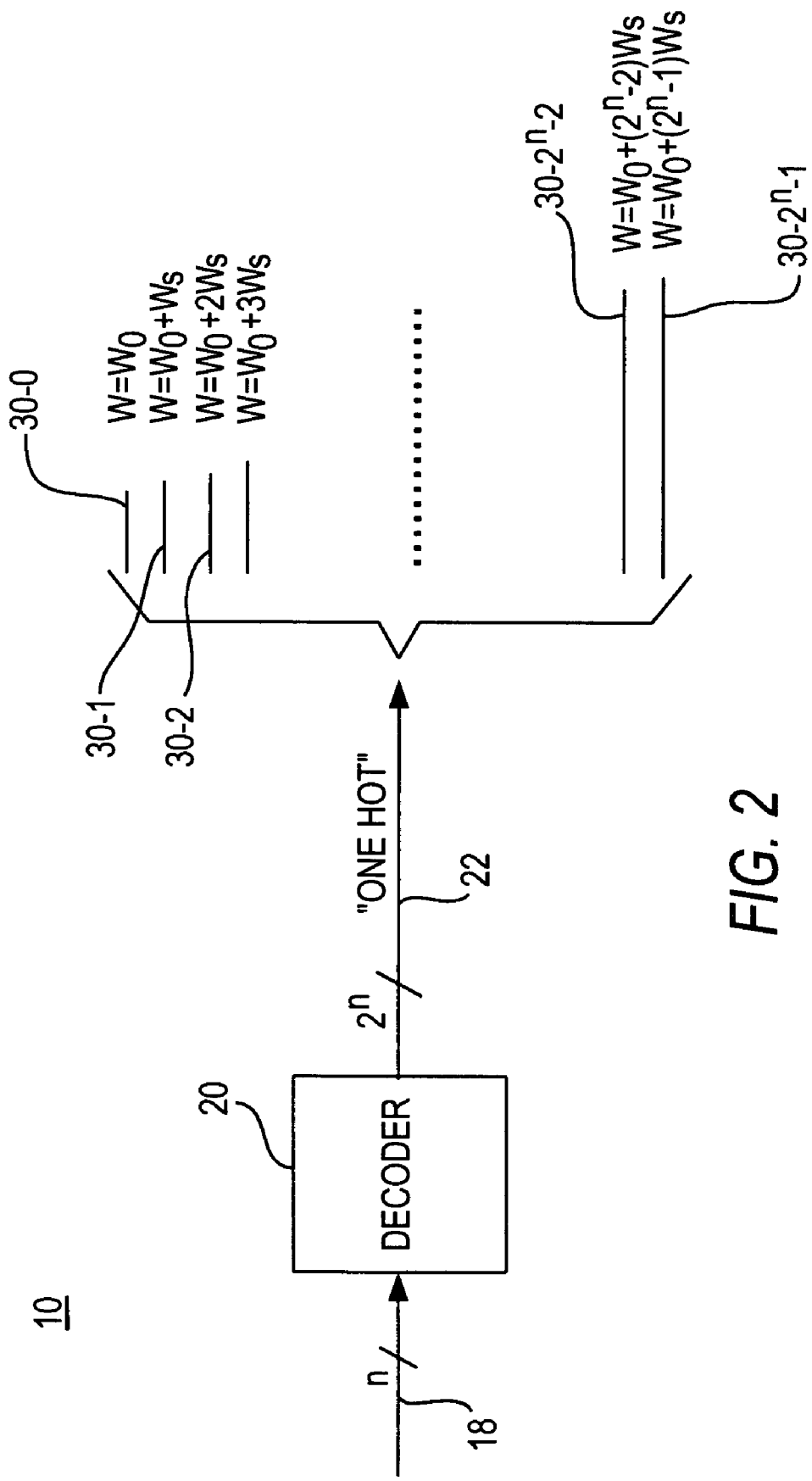
FIG. 2 is a simplified schematic block diagram of an illustrative embodiment of a portion of variable capacitance circuitry in accordance with the invention.

FIG. 2 illustrates fine capacitance tuning circuitry 10 in accordance with the invention. In this fine frequency tuning bank, $2^n$ MOS varactors with the same channel length are used, and their widths are determined as $W_i = W_0 + i*W_s$, where $i = 0, 1, 2, \ldots, 2^n-1$; $W_0$ is the width of the first varactor; and $W_s$ is the varactor width step. These varactors are respectively represented by the lines 30-0 through 30-$2^n$-1 in FIG. 2. (The first hyphen in each of these identifiers is merely a hyphen; any second hyphen in an identifier is a minus sign.) The length of each line 30 is at least schematically indicative of the width of the corresponding varactor. A capacitance increase is achieved by turning on a larger (i.e., wider) varactor 30 and turning off the previously selected smaller (i.e., narrower) varactor 30. In other words, only one of varactors 30 is turned on at any one time. All other varactors are turned off. "Turned on" means (in the context of varactors with behavior like that shown in FIG. 1) that 1V is applied to the varactor. "Turned off" means (in this context) that 0V is applied to the varactor.

Assuming that the amount of capacitance desired from bank 10 is indicated by n binary-coded control signals 18 applied to decoder 20, the above-described preferred scheme of having only one of varactors 30 on at any one time can be achieved by making decoder 20 a "one-hot" decoder. In other words, decoder 20 has $2^n$ outputs 22, one for applying either 0V or 1V to each of varactors 30, respectively. These $2^n$ outputs may be thought of as being "numbered" in the same order as the varactors to which they are connected increase in size. Decoder 20 decodes what number its inputs 18 correspond to, and then outputs 1V on only its output lead 22 having that number. Decoder 20 applies 0V to all of its other output leads 22. For example, if inputs 18 represent the number 5, decoder 20 applies 1V to its output lead numbered 5 (connected to varactor 30-5). Decoder 20 applies 0V to all of its output leads numbered 0 through 4 and 6 through $2^n-1$.

By way of a specific example, for 1.8V PMOS varactors 30 in 90 nm CMOS technology, if the varactor length is 0.2 um, a width step of 0.05 um corresponds to a capacitance step of approximately 32 aF. However, the smaller the step size, the larger the number of varactors for a given capacitance tuning range. To avoid an excessive number of varactors 30, a medium tuning bank 50 is preferably used and matched with fine tuning bank 10 as will now be described.

Figure 3:
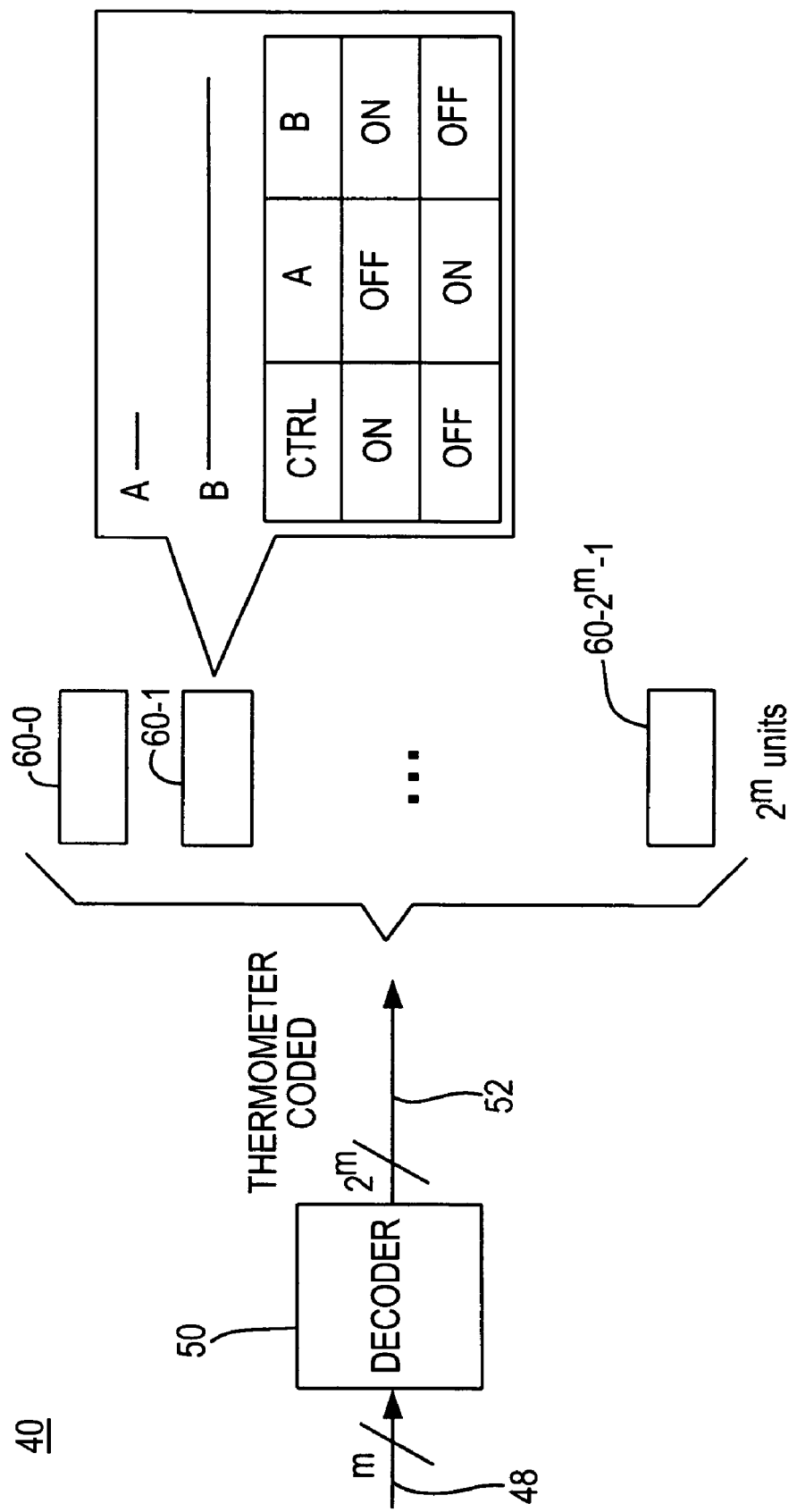
FIG. 3 is a simplified schematic block diagram of an illustrative embodiment of another portion of variable capacitance circuitry in accordance with the invention.

An illustrative embodiment of medium tuning bank 40 is shown in FIG. 3. This bank includes decoder 50 and $2^m$ instances 60 of pairs of two MOS varactors A and B. Each varactor A may have the same length as fine tuning bank varactors 30 in the fine tuning bank. The width of each varactor A may be $W_0$ (the same parameter referred to by that designation in connection with FIG. 2). The length of each varactor B may again be the same as the length of varactors A and 30. The width of each varactor B may be $2^n*W_s$ (where again these parameters have the same meanings and values referred to in connection with FIG. 1). Decoder 50 receives m binary-coded input signals 48 for controlling how the varactor pairs 60 in medium tuning bank 40 are used. In particular, decoder 50 decodes input signals 48 to convert the numerical value represented by those signals to "thermometer level" values on the $2^m$ output leads 52 of the decoder. This means that all of the leads 52 below the current thermometer level are enabled (e.g., logic 1), while all the output leads 52 at or above the current thermometer level are disabled (e.g., logic 0). For example, if the input binary value on leads 48 is 0, none of output leads 52 is on. If the input binary value on leads 48 is 1, only the output lead 52 to varactor pair 60-0 is enabled. If the input binary value on leads 48 is 5, only the output leads to varactor pairs 60-0 through 60-4 are enabled.

FIG. 3 shows the effect of turning on (enabling) the output lead 52 to a representative one of varactor pairs 60. When the control signal 52 to a pair 60 is enabled, the smaller varactor A in that pair is turned off and the larger varactor B in that pair is turned on. When the control signal 52 to a pair 60 is disabled (off), the smaller varactor A in that pair is turned on and the larger varactor B in that pair is turned off.

From the foregoing it will be appreciated that the amount of capacitance added each time one more varactor pair 60 is enabled is exactly matched with the tuning range of fine tuning bank 10. The inputs 18 to the fine tuning bank and the inputs 48 to the medium tuning bank can be respectively the less- and more-significant bits of one binary-coded control word (which can, or course, vary in value over time if desired). Assume, for example, that n is initially 0, and m is initially 3. Varactor 30-0 will be on and pairs 60-0 through 60-2 will be enabled (each varactor A in those pairs off and each varactor B in those pairs on). Now assume that n+m begins to increase, with the increase appearing first in less significant bits n. Varactor 30-0 will be turned off and increasingly wide varactors 30 in the series will be turned on as each previously-on varactor 30 is turned off. Eventually, fine tuning bank 10 will reach the end of its tuning range (varactor $30$-$2^n$–1 on). Assume that control word n+m then increases by one more of its smallest increments. This will turn off varactor $30$-$2^n$–1 and turn on varactor 30-0. It will also enable one more pair 60 (pair 60-3) in medium tuning bank 40. This means turning off varactor A in pair 60-3 and turning on varactor B in that pair. The amount of capacitance thus added in the medium bank is $2^n * W_s$, which is one more $W_s$ than was subtracted by concurrently switching the fine bank back from varactor $30$-$2^n$–1 enabled to varactor 30-0 enabled. There is thus a continuous succession of small incremental increases (or decreases) in capacitance available from fine and medium tuning banks 10 and 40 operating together as control n+m increases (or decreases) in value. Moreover, these small incremental changes are uniformly available over a very wide tuning range (basically the tuning range of medium tuning bank 40).

Figure 4:
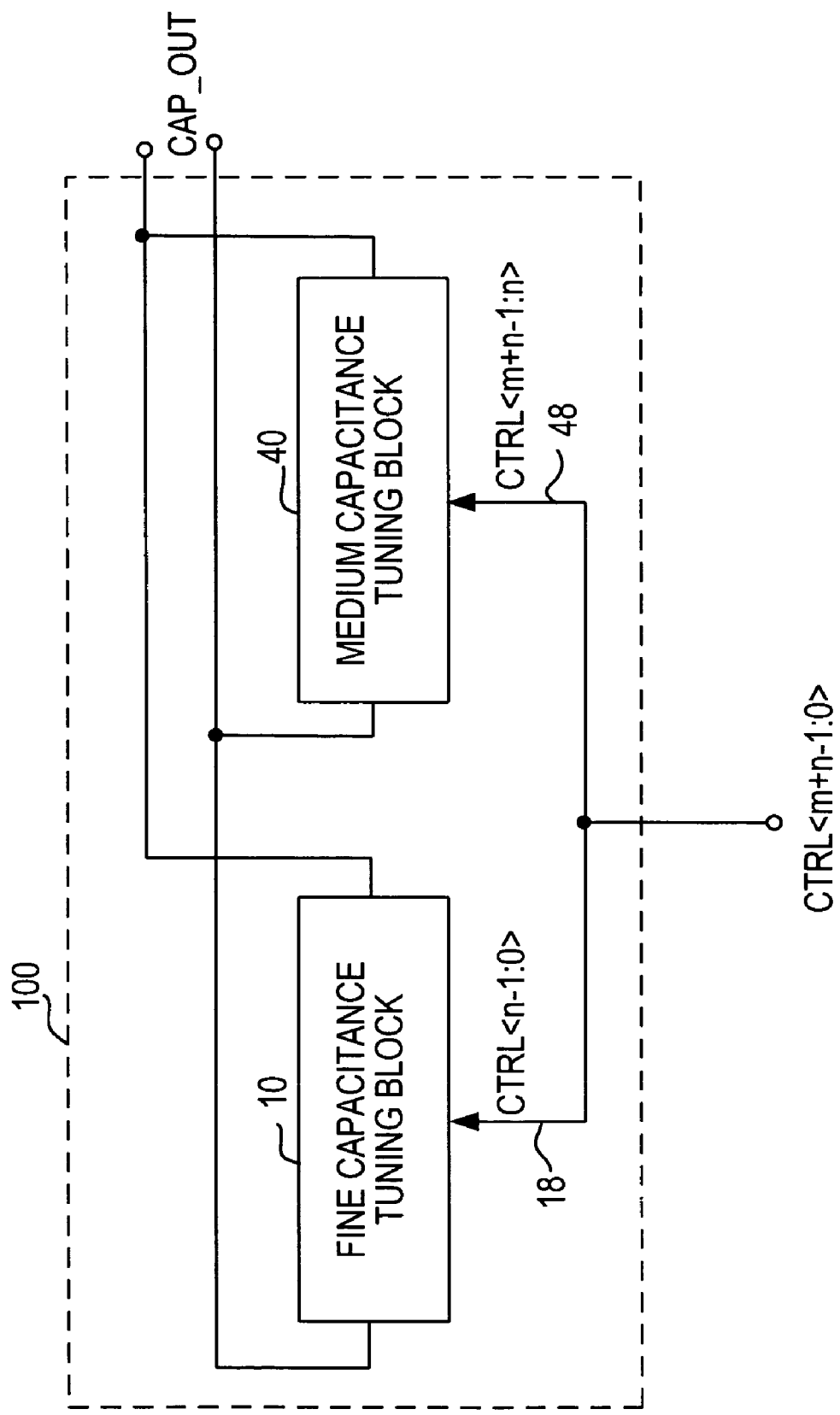
FIG. 4 is a further simplified schematic block diagram of illustrative variable capacitance circuitry in accordance with the invention.

FIG. 4 shows that fine tuning bank 10 and medium tuning bank 40 are connected in parallel with one another and a pair of capacitance output terminals (Cap_out). In this way the capacitance provided by overall circuit 100 is the sum of the capacitances provided by tuning bank 10 and tuning bank 40. (Within bank 10 all of varactors 30 are connected in parallel, but only one is providing capacitance at any one time, as described earlier. Similarly, within bank 40 all of varactors A and B are connected in parallel, but only those varactors that are then "on" (in the terms employed in FIG. 3) are providing capacitance at any given time.)

To briefly recapitulate, by combining the fine tuning and the medium tuning, capacitance tuning can be achieved as shown in FIG. 4. The control word has a width of m+n. It is split into two parts: m bits for medium capacitance tuning and n bits for fine capacitance tuning. The outputs of the two tuning banks are directly connected in parallel.

It will be understood that the foregoing is only illustrative of the principles of the invention, and that various modifications can be made by those skilled in the art without departing from the scope and spirit of the invention. For example, any desired number of varactors 30 can be used in bank 10. Similarly, bank 40 can include any desired number of varactor pairs 60.

The invention claimed is:

1. Variable capacitance circuitry comprising:
   first and second varactor sets each including a plurality of varactors connected in parallel, each of the varactors in the first varactor set being of a different size by a width step which gives each varactor a different capacitance, and each of the varactors in the second varactor set being of approximately the same size as each other varactor in the second varactor set and approximately equal to a size of a largest varactor in the first varactor set plus the width step; and
   decoder logic circuitry having outputs connected to each of the plurality of varactors in the first and second varactor sets, the decoder logic circuitry selectively enabling each of the varactors in the first and second varactor sets, wherein the decoder logic circuitry:
   enables only one varactor in the first varactor set at any one time starting with a varactor having a smallest size, and
   enables one varactor in the second varactor set at a time whenever a capacitance range of the varactors in the first varactor set is reached.

2. The circuitry defined in claim 1 wherein the different size of each varactor is due, at least in part, to each varactor having a different width.

3. The circuitry defined in claim 2 wherein each varactor in the first varactor set differs in width from another one of the varactors in the first varactor set by the width step.

4. The circuitry defined in claim 3 wherein the width step is uniform between each varactor in the first varactor set and a next narrower one of the varactors in the first varactor set.

5. The circuitry defined in claim 4 wherein the decoder logic circuitry includes a one-hot decoder.

6. The circuitry defined in claim 5 wherein:
   the varactors in the second varactor set are connected in parallel with the varactors in the first varactor set, the the varactors in the second varactor set including a plurality of units of additional capacitance, wherein the decoder logic circuitry comprises control circuitry for selectively enabling each of the units.

7. The circuitry defined in claim 6 wherein the units are all of equal unit capacitance.

8. The circuitry defined in claim 7 wherein the unit capacitance is matched to the range of capacitance that is achievable using the varactors in the first varactor set.

9. The circuitry defined in claim 8 wherein the control circuitry can enable any number of the units.

10. The circuitry defined in claim 9 wherein each of the units includes first and second varactors connected in parallel, wherein enabling a unit includes enabling the second varactor and disabling the first varactor, and wherein disabling a unit includes enabling the first varactor and disabling the second varactor.

11. The circuitry defined in claim 10 wherein the varactors in the plurality of varactors include a narrowest varactor having a minimum width and a widest varactor having a maximum width, wherein the first varactor of each unit has approximately the minimum width, and wherein the second varactor of each unit has width greater than the maximum width.

12. The circuitry defined in claim 11 wherein the width of the second varactor of each unit is greater than the maximum width by approximately the width step.

13. Variable capacitance circuitry that receives a plurality of control signals, the variable capacitance circuitry comprising:
   fine tuning circuitry coupled to receive a first portion of the control signals; and
   medium tuning circuitry connected in parallel with the fine tuning circuitry, the medium tuning circuitry coupled to receive a second portion of the control signals that is different from the first portion; wherein:
      the fine tuning circuitry includes a plurality of varactors, the plurality of varactors being connected in parallel and being graded in capacitance by a capacitance increment, and first control circuitry selectively enabling only one of the varactors in the plurality of varactors at a time beginning with a varactor having a smallest capacitance; and
      the medium tuning circuitry includes a plurality of capacitance units, all of the capacitance units being connected in parallel and having a capacitance being approximately equal to a capacitance of a largest of the varactors in the plurality of varactors plus the capacitance increment, and second control circuitry selectively enabling each of the plurality of capacitance units one at a time whenever a capacitance range of the fine tuning circuitry is reached.

14. The circuitry defined in claim 13 wherein the varactors in the plurality of varactors are graded in capacitance from a smallest capacitance to a largest capacitance, each of the varactors having capacitance greater than the varactor having the next smaller capacitance by the capacitance increment that is substantially the same between any two of the varactors that are adjacent to one another in capacitance.

15. The circuitry defined in claim 14 wherein each of the units includes a first varactor having a relatively small capacitance connected in parallel with a second varactor having a relatively large capacitance, only the second varactor being enabled when the unit is enabled, and only the first varactor being enabled when the unit is not enabled.

16. The circuitry defined in claim 15 wherein the first varactor in each of the units has approximately the smallest capacitance, and wherein the second varactor in each of the units has approximately the greatest capacitance plus the capacitance increment.

17. Variable capacitance circuitry that receives a plurality of control signals, the variable capacitance circuitry comprising:
   fine tuning circuitry coupled to receive a first portion of the control signals; and
   medium tuning circuitry connected in parallel with the fine tuning circuitry, the medium tuning circuitry coupled to receive a second portion of the control signals different from the first portion; wherein:
      the fine tuning circuitry includes a plurality of varactors, the plurality of varactors being connected in parallel and graded in width by a width step, and first control circuitry selectively enabling only one of the varactors in the plurality at a time beginning with a varactor having a smallest width; and
      the medium tuning circuitry includes a plurality of capacitance units, all of the capacitance units being connected in parallel and having a size being approximately equal to a size of a largest varactor in the plurality of varactors plus the width step, and second control circuitry selectively enabling each of the plurality of the capacitance units one at a time whenever a capacitance range of the fine tuning circuitry is reached.

18. The circuitry defined in claim 17 wherein the varactors in the plurality of varactors are graded in width from a narrowest varactor having a minimum width to a widest varactor having a maximum width, each of the varactors being wider than the next narrower varactor by the width step that is substantially the same between any two of the varactors that are adjacent to one another in width.

19. The circuitry defined in claim 18 wherein each of the units includes a first relatively narrow varactor connected in parallel with a second relatively wide varactor, only the second varactor being enabled when the unit is enabled, and only the first varactor being enabled when the unit is not enabled.

20. The circuitry defined in claim 19 wherein the first relatively narrow varactor in each of the units has width approximately equal to the minimum width, and wherein the second relatively wide varactor in each of the units has width approximately equal to the maximum width plus the width step.

21. The circuitry defined in claim 17 wherein the first control circuitry comprises decoding logic circuitry connected to each of the varactors.

22. The circuitry defined in claim 21 wherein the decoding logic circuitry is a one-hot decoder.

23. The circuitry defined in claim 17 wherein the second control circuitry comprises decoding logic circuitry connected to each of the varactors.

24. The circuitry defined in claim 23 wherein the decoding logic circuitry is a thermometer level decoder.

25. The circuitry defined in claim 17 wherein the first control circuitry comprises a one-hot decoder and the second control circuitry comprises a thermometer level decoder.

* * * * *